(12) United States Patent
Zhang et al.

(10) Patent No.: US 8,716,784 B2
(45) Date of Patent: May 6, 2014

(54) SEMICONDUCTOR DEVICE AND ASSOCIATED FABRICATION METHOD

(75) Inventors: Lei Zhang, Chengdu (CN); Tiesheng Li, San Jose, CA (US)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 51 days.

(21) Appl. No.: 13/278,463

(22) Filed: Oct. 21, 2011

(65) Prior Publication Data

US 2012/0098058 A1    Apr. 26, 2012

(30) Foreign Application Priority Data

Oct. 22, 2010    (CN) .......................... 2010 1 0526997

(51) Int. Cl.
| | |
|---|---|
| *H01L 29/76* | (2006.01) |
| *H01L 29/94* | (2006.01) |
| *H01L 29/80* | (2006.01) |
| *H01L 31/062* | (2012.01) |
| *H01L 31/113* | (2006.01) |

(52) U.S. Cl.
USPC ........... 257/330; 257/280; 257/281; 257/284; 257/288

(58) Field of Classification Search
USPC ......... 257/330, 109, 280, 281, 284, 288, 401, 257/409, 331, 471, 342, 365, 77, 334, 328, 257/327, 499, 155, 341, 479, 329, 146
See application file for complete search history.

(56) References Cited

U.S. PATENT DOCUMENTS

| | | | |
|---|---|---|---|
| 6,351,018 B1* | 2/2002 | Sapp .............................. | 257/499 |
| 7,977,193 B1 | 7/2011 | Disney et al. | |
| 2005/0029585 A1* | 2/2005 | He et al. ........................ | 257/330 |
| 2006/0214221 A1* | 9/2006 | Challa et al. .................. | 257/328 |
| 2008/0265312 A1* | 10/2008 | Bhalla et al. .................. | 257/328 |
| 2010/0289075 A1* | 11/2010 | Lin et al. ........................ | 257/334 |
| 2010/0302810 A1 | 12/2010 | Hsing et al. | |
| 2011/0057259 A1 | 3/2011 | Li | |

OTHER PUBLICATIONS

U.S. Appl. No. 12/980,143, filed Oct. 28, 2011 by Li et al.

* cited by examiner

*Primary Examiner* — Chuong A. Luu
(74) *Attorney, Agent, or Firm* — Perkins Coie LLP

(57) ABSTRACT

A semiconductor device and a method for forming the semiconductor device wherein the semiconductor comprises: a trench MOSFET, formed on a semiconductor initial layer, comprising a well region, wherein the semiconductor initial layer has a first conductivity type and wherein the well region has a second conductivity type; an integrated Schottky diode next to the trench MOSFET, comprising a anode metal layer contacted to the semiconductor initial layer; a trench isolation structure, coupled between the trench MOSFET and integrated Schottky diode, configured to resist part of lateral diffusion from the well region; wherein the well region comprises an overgrowth part which laterally diffuses under the trench isolation structure and extends out of it.

14 Claims, 6 Drawing Sheets

SEMICONDUCTOR DEVICE AND ASSOCIATED FABRICATION METHOD

CROSS-REFERENCE TO RELATED APPLICATION(S)

This application claims the benefit of CN application No. 201010526997.6, filed on Oct. 22, 2010, and incorporated herein by reference.

TECHNICAL FIELD

The disclosed invention relates to semiconductor device and associated fabrication method, and more particular relates to semiconductor device and associated fabrication method which integrates trench metal-oxide semiconductor field effect transistor (MOSFET) and Schottky diode.

BACKGROUND

Nowadays, direct current to direct current (DC/DC) converters are widely utilized to satisfy the power supply requirements of electronic applications. In some applications, DC/DC converters generally utilize the trench MOSFET as a high efficiency switch.

In conventional synchronous DC/DC converter circuits, to avoid shoot-through current damaging the MOSFET, it is forbidden to turn on the primary MOSFET and the synchronous rectifier MOSFET at the same time. Before either MOSFET is turned on, both of the MOSFETs need to be turned off first. This period of turning off both MOSFETs is called dead time. During the dead time, current is able to flow through the parasitic PN diode inside the trench MOSFET. However, the parasitic diode has a relative high forward voltage drop (approximate 0.7V), which reduces the efficiency of the converter. Moreover, Since PN diode is a type of minority-carrier device, the backward recovery characteristic of PN parasitic diode is relative poor.

Compared with PN diode, Schottky diode has a smaller forward voltage drop because of the metal-semiconductor contact structure. Also Schottky diode is a type of majority-carrier device, so it has better backward recovery performance. With these advantages, Schottky diode is integrated into MOSFET and parallel-coupled with the PN parasitic diode, configured to achieve lower power consumption and higher switching speed.

Generally, a trench MOSFET integrating Schottky diode has such a structure that a completely diffused p-type well or an extra deeper p-type well beside Schottky diode area pinches off this area under low drain voltage. But for completely diffused p-type well, a large area of die may be taken up for the big size p-type well due to its deep junction. For an extra deeper p-type well, additional masks and process steps may be added. Moreover, both of these devices have low die size utilization rates. Thus, an improved device is desired.

SUMMARY

One embodiment of the present invention discloses a semiconductor device comprising a trench MOSFET, a Schottky diode and a trench isolation structure. Wherein the trench MOSFET may be formed on a semiconductor initial layer and the trench MOSFET comprise a well region, wherein the semiconductor initial layer has a first conductivity type and wherein the well region has a second conductivity type. The integrated Schottky diode may comprise an anode metal layer contacting the semiconductor initial layer. The trench isolation structure is coupled between the trench MOSFET and integrated Schottky diode, configured to resist part of the well region from laterally diffusing. And wherein the well region comprises an overgrowth part which laterally diffuses under the trench isolation structure and extends over the trench isolation structure.

BRIEF DESCRIPTION OF THE DRAWINGS

The drawings are ideal schematic diagram for illustrating the embodiments of the present invention. One with ordinary skill in relevant art should understand and predict that due to specific fabrication technology and tolerance, the practical topography of certain part may differ from it shown in the drawings. For an example, the rectangle-shaped diffusion area in the illustrated drawings may practically have a curving edge and/or a doping gradient rather than an abruption on the interface. Meanwhile, remnant injection may be left in the area between surface and the buried layer. Accordingly, the area sharps shown in the drawings are illustrative and not intended to limit the range of the present invention. It should also be understood that the drawings are not scale-depicted. The layer and area depicted in the drawings may be magnified for clear illustration purpose.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present technology may be practiced without these specific details. In other instances, well-known methods, procedures, components, and circuits have not been described in detail so as not to unnecessarily obscure aspects of the present invention.

One of ordinary skill in relative art should understand that certain conductivity types of the semiconductor materials described in the following text are for the interpretation of certain embodiments. However, alternative conductivity types of the semiconductor materials may also apply according to other embodiments of the present technology.

The labels of "+" and "−" in the following text and the drawings are to describe the relative doping concentration of certain areas. However, it does not intend to limit the absolute doping range or other aspects of these areas. For example, a doping area described as N+ or N− may also be described as N-type doping area alternatively.

Figure 1:
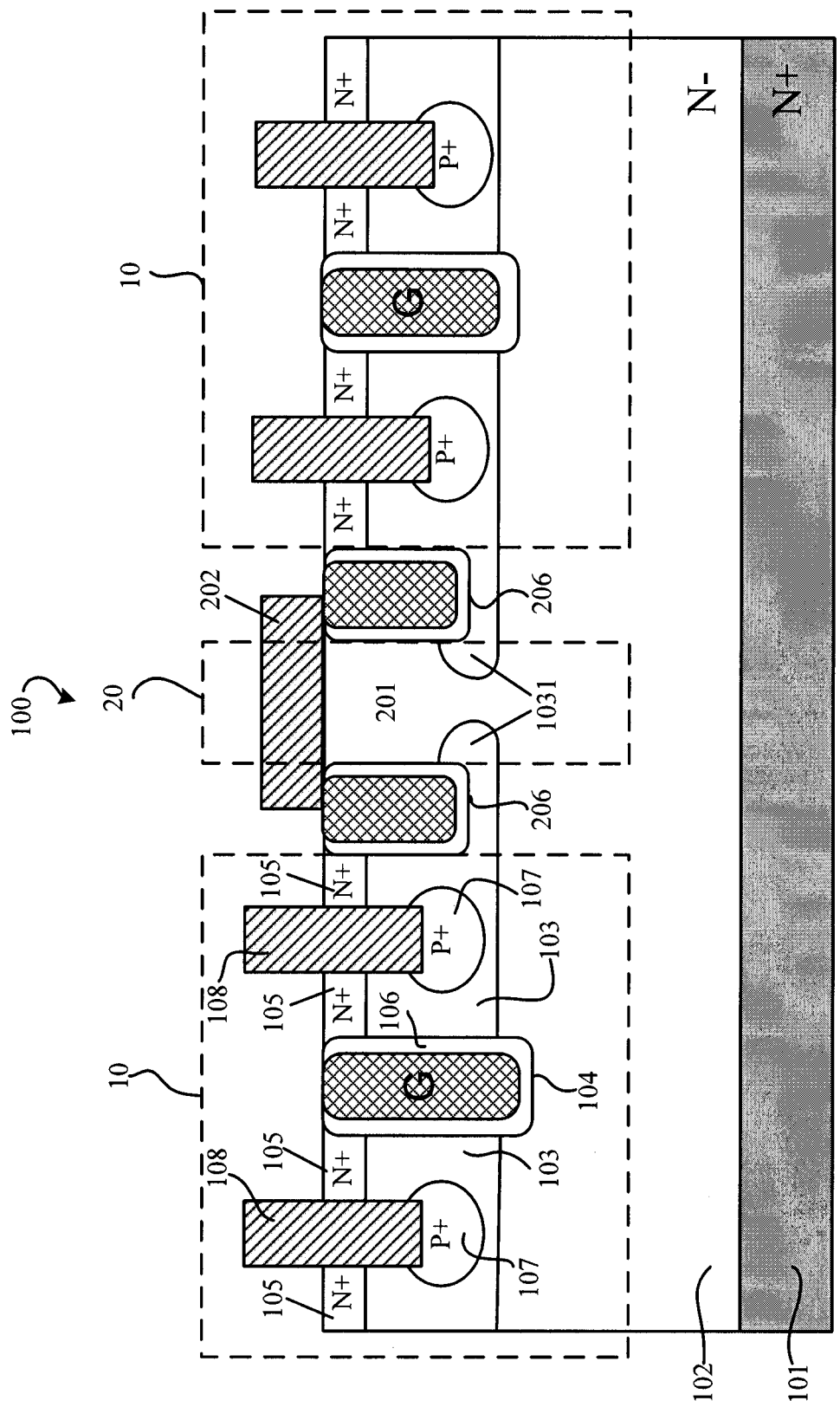
FIG. 1 illustrates a schematic cross-sectional view of a semiconductor device 100 integrating trench MOSFET and Schottky diode according to an embodiment of the present invention.
Figure 2:
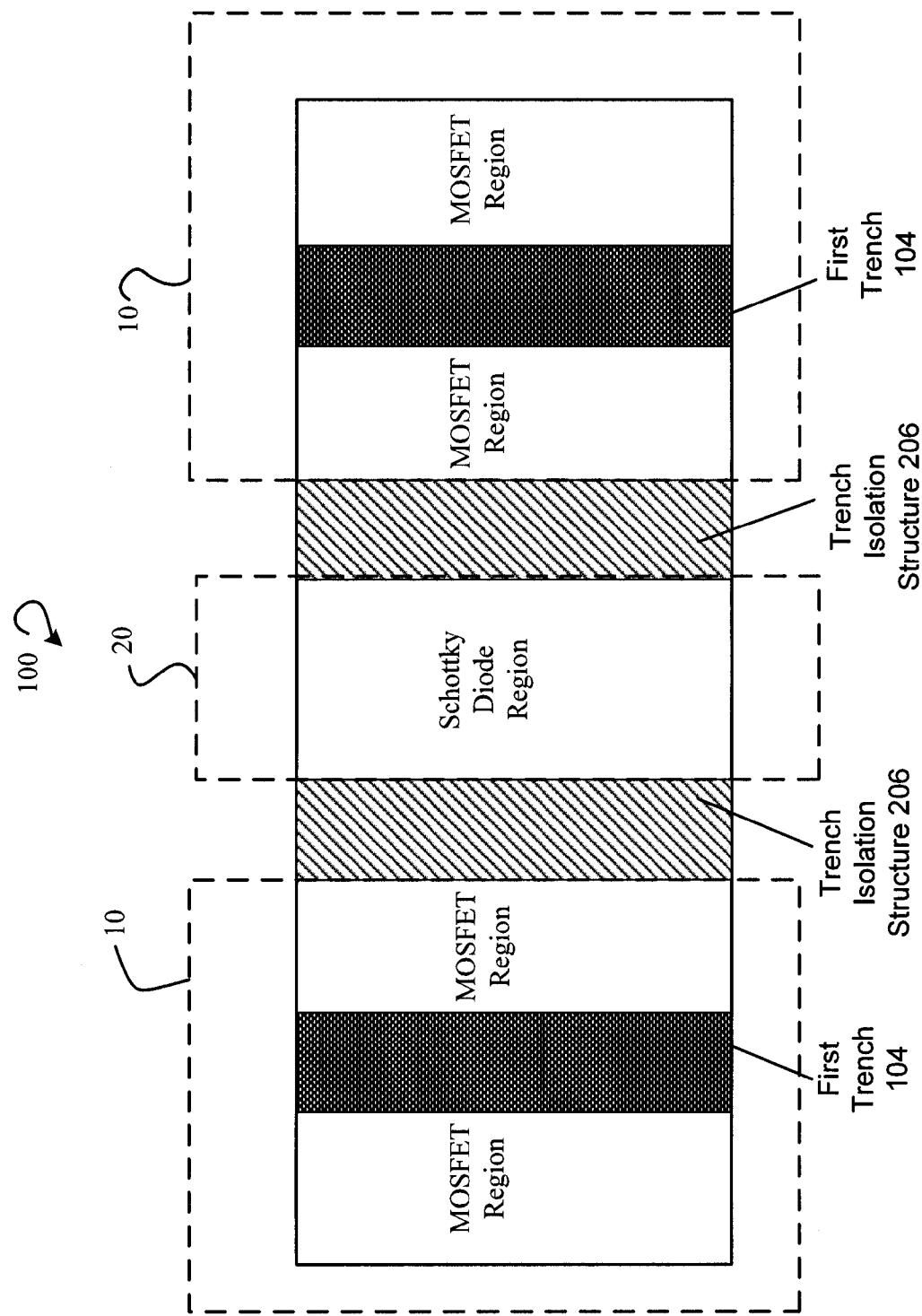
FIG. 2 illustrates a schematic top-view of the semiconductor device 100 integrating trench MOSFET and Schottky diode according to an embodiment of the present invention.

FIG. 1 illustrates a schematic cross-sectional view of a semiconductor device 100 integrating trench MOSFET and Schottky diode according to an embodiment of the present invention. FIG. 2 illustrates a schematic top-view of the semiconductor device 100 integrating trench MOSFET and Schottky diode. Seen in FIG. 2, the parts formed on the surface of semiconductor substrate are omitted for clearly illustrating the distribution of the semiconductor devices at each area of the semiconductor substrates.

As shown in FIG. 1 and FIG. 2, a semiconductor device 100 according to an embodiment of the present invention may at least comprise a trench MOSFET 10, a Schottky diode 20 and a trench isolation structure 206 between them. In an embodiment, an N-type semiconductor initial layer may comprise an N+ substrate 101 and an N− epitaxy 102 formed on N+ substrate 101. In another embodiment, N-type semiconductor initial layer may only comprise an N-type semiconductor substrate. A P− well region 103 is formed on N− epitaxy 102. An N+ layer 105 is further formed on the upper surface of P− well region 103. In the illustrated embodiment, N+ layer 105 may be utilized as the source region of trench MOSFET 10 and the N-type semiconductor initial layer may be utilized as the drain region of trench MOSFET 10.

A first trench 104 stretch through source region 105 and P− well region 103 into the N-type substrate or N− epitaxy 102. The side wall of first trench 104 may be covered with gate insulation material layer 106. In one embodiment, gate insulation material may comprise silicon oxide. A gate structure G of the trench MOSFET 10 may be formed on first trench 104 and made of poly-silicon.

A source electrode 108 is contacted to source region 105. In one embodiment, source electrode 108 may formed on the surface of source region 105. In another embodiment, source electrode 108 may stretch through source region and into P− well region 103. Wherein in certain embodiment, inside P− well region 103, a P+ region 107 may be formed around the end part of source electrode 108. Therefore the resistance of P− well 103 at this area is reduced and the unclamped inductive switching (UIS) ability of the device is improved.

Continuing seen in FIG. 1 and FIG. 2, Schottky diode 20 is located next to trench MOSFET 10 and isolated from it by trench isolation structure 206. Schottky diode 20 comprises an N-type semiconductor initial layer part 201 and an anode metal layer 202 formed on the N-type semiconductor initial layer part 201. Therefore a semiconductor-metal contact interface is formed. In the illustrated embodiment, N-type semiconductor part 201 may be a part of N− epitaxy 102 which is between two adjacent trench isolation structures 206 and the N+ substrate 101 is utilized as cathode of Schottky diode 20. In another embodiment, N-type semiconductor initial layer part 201 may be a part of an N-type semiconductor substrate and the N-type semiconductor may also be utilized as cathode of Schottky diode 20. Anode metal layer 202 of Schottky diode 20 may be electrically coupled with source electrode 108 of trench MOSFET 10.

Trench isolation structure 206 is coupled between trench MOSFET 10 and Schottky diode 20. In one embodiment, trench isolation structure 206 may comprise a gate structure which is consistent with the gate G in first trench 104. One with ordinary skill in relevant art should note that the gate structure stated hereby and in the following text may not comprise a function the same as the gate G. Anode metal layer 202 may either contact to the gate structure of trench isolation structure 206 or not. In another embodiment, trench isolation structure 206 may be totally filled with insulation material such as silicon oxide. The first trench 104 and the trench isolation structure 206 may be formed simultaneously or separately depending on the specific design of trench isolation structure 206. The methods for forming such structures will be described in further detail with respect to the following text.

In the illustrated embodiment shown in FIG. 1, trench isolation structure 206 may be shallower than the bottom surface of P− Well region 103. As a result, trench isolation structure 206 may resist part of lateral diffusion from P− well region 103 configured to form trench MOSFET 10 with a relative small P− well region 103. This feature may save die area cost to obtain a compact layout. In addition, under the trench isolation structure 206, P− well region 103 may laterally diffuse toward Schottky diode 20. In certain embodiments, P− well region 103 may excess to the side wall of trench isolation structure 206 to form an overgrowth part 1031 in N-type semiconductor part 201. The overgrowth part 1031 may benefit to pinch off Schottky diode area with a relative low drain voltage and improve the breakdown voltage of Schottky diode 20. For example, in one embodiment, Schottky diode 20 may have a breakdown voltage the same as trench MOSFET 10. Thus the semiconductor device according to the illustrated embodiment may further have an improved performance.

Referring to FIG. 1 and FIG. 2, in certain embodiments, Schottky diode 20 may be inserted into two adjacent trench MOSFETs 10 and separated apart from them by two trench isolation structures 206 respectively. Hence the flowing current path of Schottky diode 206 is restricted between two adjacent trench isolation structures 206. One with ordinary skill in relevant art should understand that Schottky diode 20 may be inserted into any two adjacent trench MOSFETs 10 in die configured to increase the utility ratio of die area.

It should be noted that the semiconductor device according to some embodiments of the present invention may not comprises all of features described above. In certain embodiments, the semiconductor device may comprise only a part of features.

FIG. 3A-3F illustrates a cross-sectional view of the semiconductor substrate undergoing a process to form the semiconductor device integrating trench MOSFET and Schottky diode. The description in the following text will omit the information about publicly known technology of steps, processes, materials, dopants and etc. And one of ordinary skill in relevant art should understand the process steps are not limited by described embodiment in the following text. In other embodiments, the process steps may be applied with a different sequence.

Figure 3A:
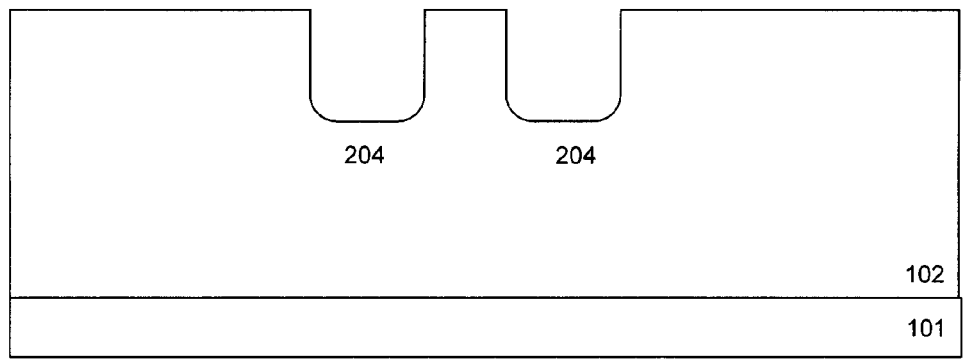
FIG. 3A-3F illustrates a partially schematic cross-sectional view of a semiconductor substrate undergoing a process for forming a semiconductor device integrating trench MOSFET and Schottky diode according to an embodiment of the present invention.
Figure 3B:
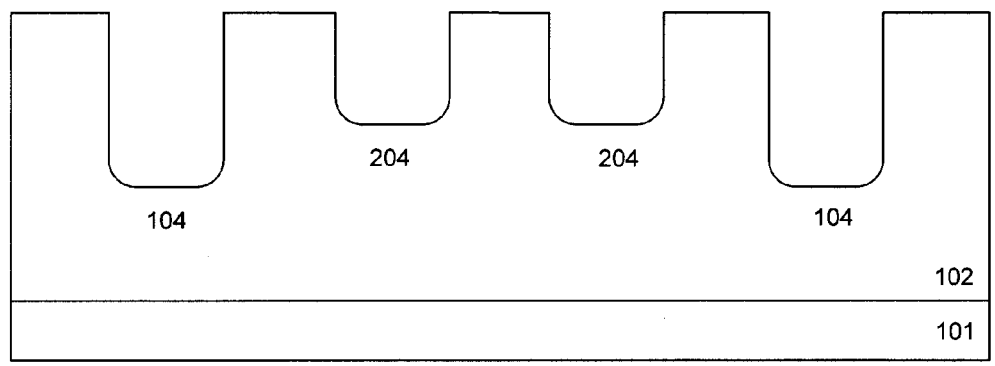

Seen in FIGS. 3A and 3B, a first trench 104 and a second trench 204 are formed on an N-type initial layer. The N-type initial layer may comprise an N+ semiconductor 101 and an N− epitaxy layer 102 formed on it. In the illustrated embodiment shown in FIGS. 3A and 3B, second trench 204 is formed firstly. Then first trench 104 is formed deeper than second trench 204.

Figure 4:
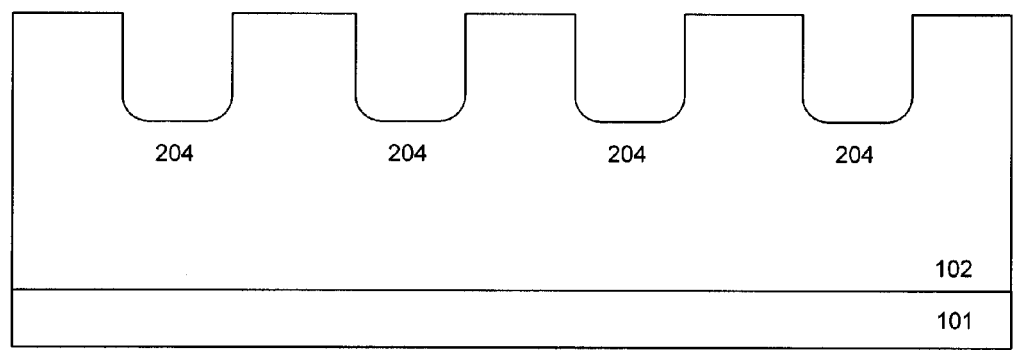
FIG. 4 illustrates a partially schematic cross-sectional view of a semiconductor substrate undergoing another process to replace the process shown in FIG. 3A for forming a semiconductor device integrating trench MOSFET and Schottky diode according to another embodiment of the present invention.
Figure 5:
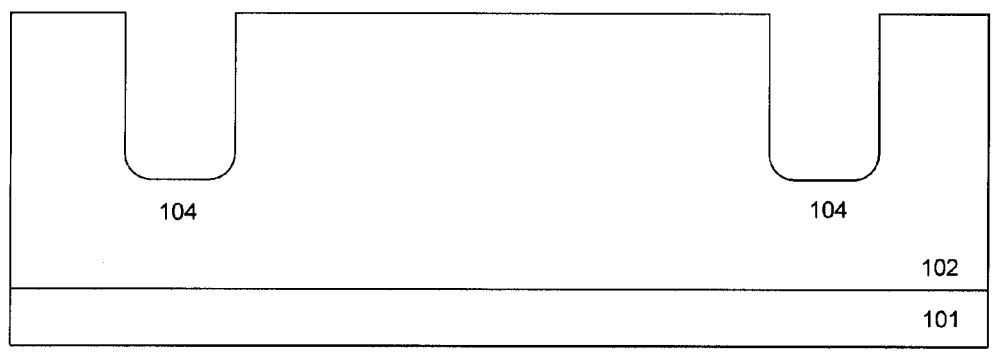
FIG. 5 illustrates a partially schematic cross-sectional view of a semiconductor substrate undergoing yet another process to replace the process shown in FIG. 3A for forming a semiconductor device integrating trench MOSFET and Schottky diode according to yet another embodiment of the present invention.

However, in other embodiment, alternative process step may be applied. As the illustrated embodiment shown in FIG. 4, a plurality of second trenches 204 may be formed firstly. Then a part of second trenches 204 are deepened to form first trench 104. In another embodiment shown in FIG. 5, first trench 104 may be formed firstly. After that, second trench 204 is formed shallower than first trench 104.

Figure 3C:
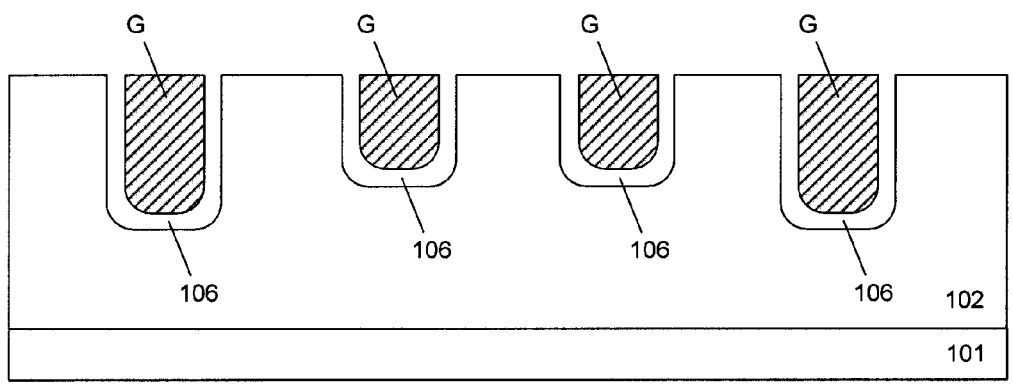

Turning to FIG. 3C, in the illustrated embodiment, gate insulation layer 106 and gate G are formed on both first trench 104 and second trench 204. The fabrication process flow may comprise, for example, depositing an insulation material layer and gate material layer in turn firstly. Afterward, the insulation material and the gate material outside trench 104 and 204 are eliminated by etching or polishing.

According to the above description, in another embodiments, second trench 204 may be totally filled with insulation material. In such occasion, insulation material, e.g. silicon oxide, may be only filled into second trench 204 while first trench 104 is masked.

One with ordinary skill in relevant art should understand that the fabrication process detail illustrated above and hereby is not intended to limit the invention. Alternative process flow sequence or other different process step may also be applied into the embodiments of the present invention. For an instance, first trench 104 and its gate structure may be finished and masked firstly. Next, second trench 204 and trench insulation structure 206 are formed, vice versa.

Figure 3D:
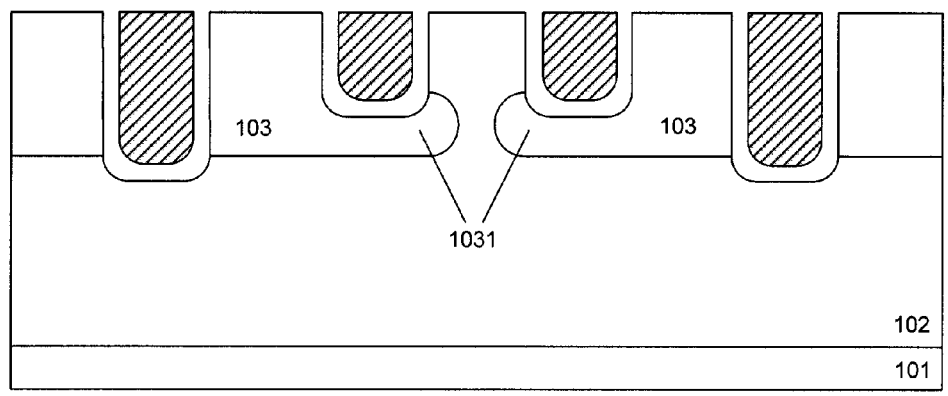

Seen in FIG. 3D, selective ion implantation is applied to form P− well region 103. The ion is implanted at the initial semiconductor layer region between first trench 104 and adjacent second trench 204. The depth of P− well region 103 may larger than the depth of second trench 204 but smaller than the depth of first trench 104. In the depicted figure, a diffusion process is further be utilized. Through this process, P− well region 103 may laterally diffuse under second trench 204 and extend out of it to form an overgrowth part 1031.

Figure 3E:
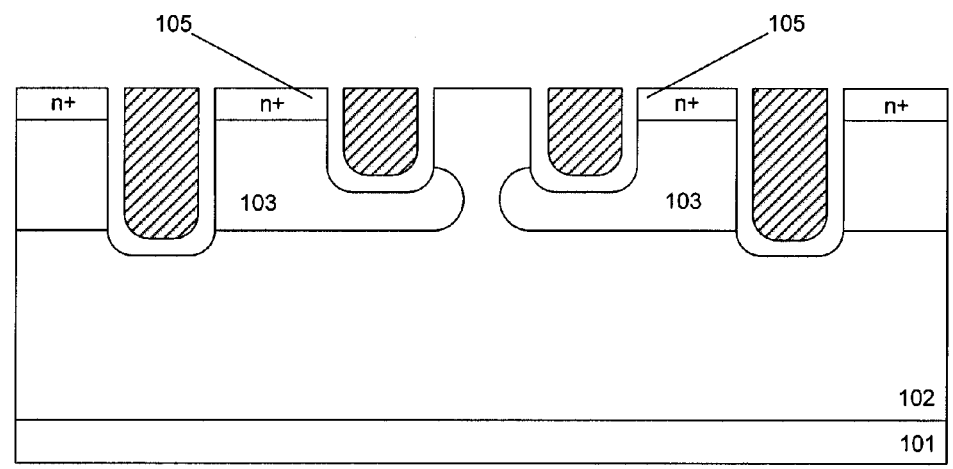

FIG. 3E illustrates process of forming N+ source region 105 on the upper surface of P− well region 103.

Figure 3F:
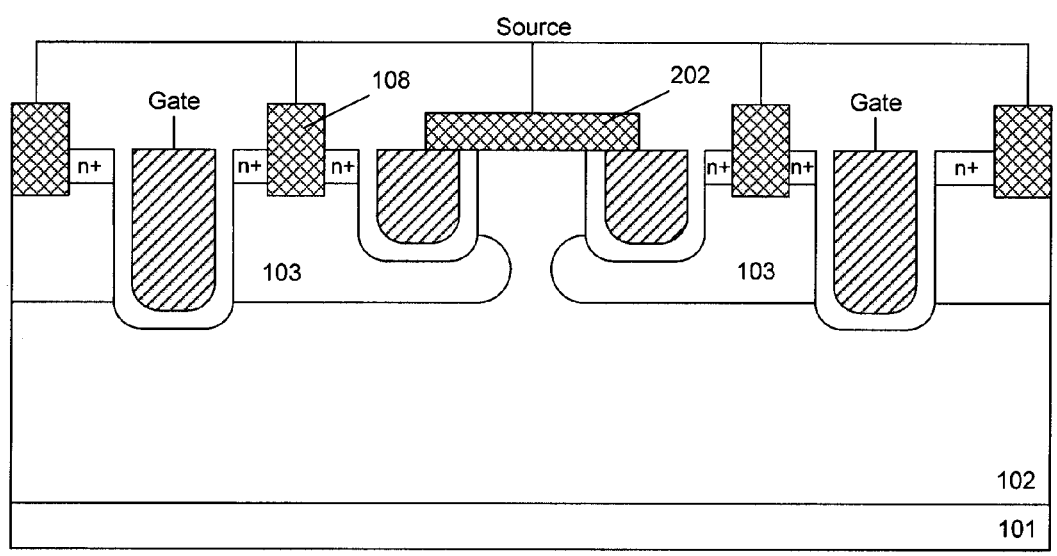

Switching to FIG. 3F, source electrode 108 is formed on N+ source N+ source region 105. Meanwhile anode metal layer 202 of Schottky diode 20 is formed on part of the N-type semiconductor initial layer which is between two adjacent second trenches 204. Anode metal layer 202 may contact to the gate structure of second trench 204 and be electrically coupled to source electrode 108. In FIG. 3F, source electrode 108 passes through source region 105 and extends into P− well region 103. In another embodiment, source electrode 108 may be positioned in the surface of source region 105 (not shown). In yet another embodiment, inside P− well region 103, a P+ region 107 may be formed around the end part of source electrode 108 which is in P− well region 103.

After then, subsequent procedure may be utilized to finish the fabrication of semiconductor device.

The above structures or components are mentioned either in N type or P type. However, the doping type for the structures or parts in each embodiment can be the opposite.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A semiconductor device, comprising:
   a trench metal-oxide semiconductor field effect transistor (MOSFET), formed on a semiconductor initial layer, the trench MOSFET comprising a well region on the semiconductor initial layer, wherein the semiconductor initial layer has a first conductivity type and wherein the well region has a second conductivity type;
   a Schottky diode, comprising an anode metal layer, wherein the anode metal layer is above and contacting the semiconductor initial layer; and
   a trench isolation structure, coupled between the trench MOSFET and the Schottky diode, configured to block part of the well region from laterally diffusing;
   wherein the well region comprises an overgrowth part under the trench isolation structure, and wherein the overgrowth part laterally diffuses and extends over the trench isolation structure.

2. The semiconductor device according to claim 1, wherein the first conductivity type is N-type and wherein the second conductivity type is P-type.

3. The semiconductor device according to claim 1, wherein the trench isolation structure comprises a gate structure.

4. The semiconductor device according to claim 1, wherein the trench isolation structure comprises an insulation material.

5. The semiconductor device according to claim 1, wherein the insulation material is silicon oxide.

6. The semiconductor device according to claim 1, wherein the trench MOSFET further comprises a source region and a source electrode, wherein the source region has the first conductivity type, and wherein the source electrode is electrically coupled to the anode metal layer.

7. The semiconductor device according to claim 6, wherein the source electrode extends through the source region and into the well region, wherein the trench MOSFET further comprises a heavily doped region in the well region, wherein the heavily doped region has the second conductivity type and wherein the heavily doped region is around the end part of the source electrode.

8. The semiconductor device according to claim 1, wherein the trench MOSFET further comprises a trench gate, wherein the depth of the trench gate is larger than the depth of the trench isolation structure.

9. The semiconductor device according to claim 1, wherein the semiconductor initial layer comprises a semiconductor substrate, wherein the semiconductor substrate is utilized as a drain region of the trench MOSFET, and wherein the semiconductor substrate is further utilized as a cathode region of the Schottky diode.

10. A semiconductor device, comprising
    a semiconductor initial layer, having a first conductivity type;
    a well region, formed on the semiconductor initial layer, the well region having a second conductivity type;
    a source region, formed on the surface of the well region, the source region having a first conductivity type;
    a first trench, stretching through the well region and extending to the semiconductor initial layer, the first trench comprising a gate structure;
    a second trench next to the well region, the second trench comprising a trench isolation structure configured to block part of the well region from laterally diffusing; and an anode meta layer formed on part of the semiconductor initial layer, wherein the anode metal layer is between two second trenches;

wherein the well region comprises an overgrowth part under the second trench, and wherein the overgrowth part laterally diffuses and extends over the second trench.

11. The semiconductor device according to claim 10, wherein a gate structure is further formed in the second trench.

12. The semiconductor device according to claim 10, wherein an insulation material layer is further formed in the second trench.

13. The semiconductor device according to claim 10, wherein the first trench is deeper than the second trench.

14. The semiconductor device according to claim 10, further comprising:
   a source electrode, stretching through the source region and into the well region, wherein the source electrode is electrically coupled to the anode metal layer; and
   a heavily doped region in the well region, wherein the heavily doped region has the second conductivity type and wherein the heavily doped region is around the end part of the source electrode.

* * * * *